United States Patent [19]

Milligan

[11] 4,118,667
[45] Oct. 3, 1978

[54] METHOD FOR MAKING A HEAT SENSITIVE FAULT DETECTING AND INDICATING DEVICE FOR WATTHOUR METER

[75] Inventor: James W. Milligan, West Lafayette, Ind.

[73] Assignee: Duncan Electric Co., Inc., Lafayette, Ind.

[21] Appl. No.: 761,467

[22] Filed: Jan. 21, 1977

Related U.S. Application Data

[62] Division of Ser. No. 585,110, Jun. 9, 1975, Pat. No. 4,017,795.

[51] Int. Cl.² ............................................. G01R 1/36
[52] U.S. Cl. ..................................... 324/110; 73/358; 116/114.5
[58] Field of Search .................. 324/110; 340/253 A; 73/358; 116/114.5

[56] References Cited

U.S. PATENT DOCUMENTS

| | | | |
|---|---|---|---|
| 1,935,093 | 11/1933 | Keller | 340/253 A |
| 1,994,222 | 3/1935 | LeRoy | 340/253 A |
| 2,236,277 | 3/1941 | Sturtevant | 324/110 |
| 3,588,689 | 6/1971 | Crawford | 73/358 |

Primary Examiner—Rudolph V. Rolinec
Assistant Examiner—Ernest F. Karlsen
Attorney, Agent, or Firm—John R. Nesbitt

[57] ABSTRACT

A method for making a heat sensitive fault detecting and indicating device for a watthour meter is disclosed herein. The illustrated method is particularly useful for a watthour meter that conventionally includes a potential stator and a current stator both of which are mounted thereon one or more permanent magnets and a rotatable disk assembly with disk rotation being recorded on the recording dials of a register assembly visible through the enclosing glass cover of the meter. The current stator of such a meter normally includes a pair of current coils that are heat responsive and a method is disclosed for providing a heat sensitive fault detecting and indicating device that may be associated with such coils. The method includes providing a layer of heatable material, such as a low melting point metal, for example, which layer is covered by a covering such as a sheath, for example, with predetermined portions of the sheath being thinned, as by embossing, for example, with a predetermined symbol or other indicia so that when a current surge is experienced at the watthour meter producing sufficient heat at the current coils, the low melting point metal melts and penetrates the thinned area of the sheath to thereafter indicate that a possibly damaging surge has been experienced by the meter. The indication that a surge has occurred is thus made readily visible at the sheath.

3 Claims, 6 Drawing Figures

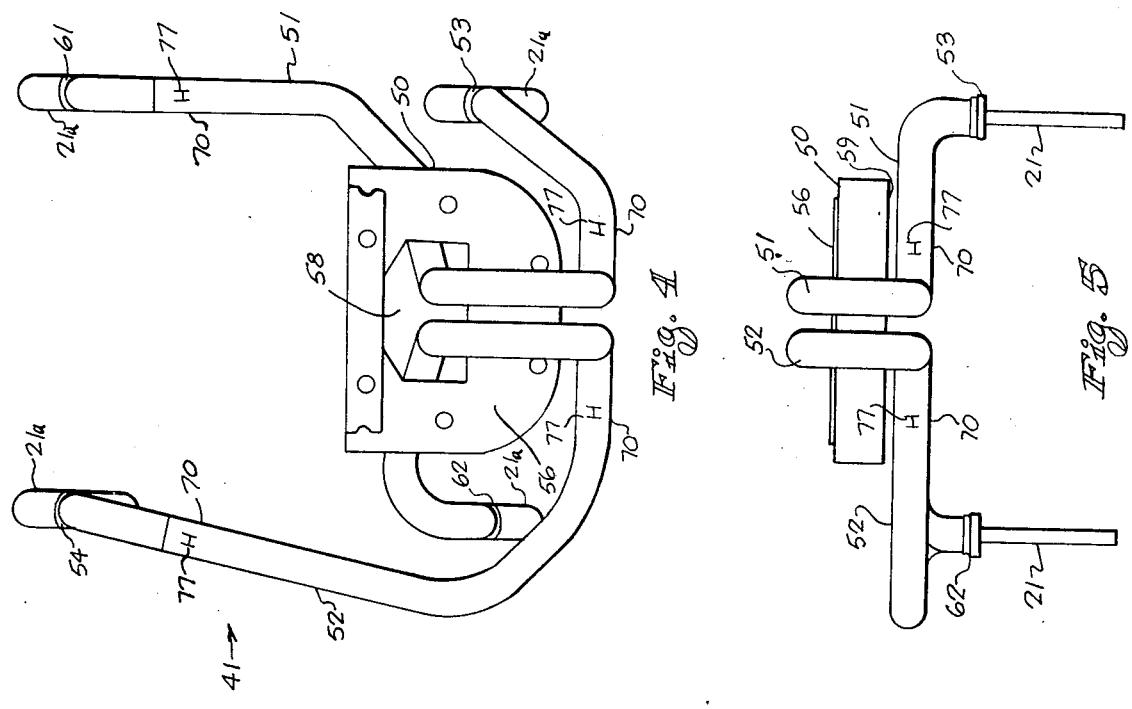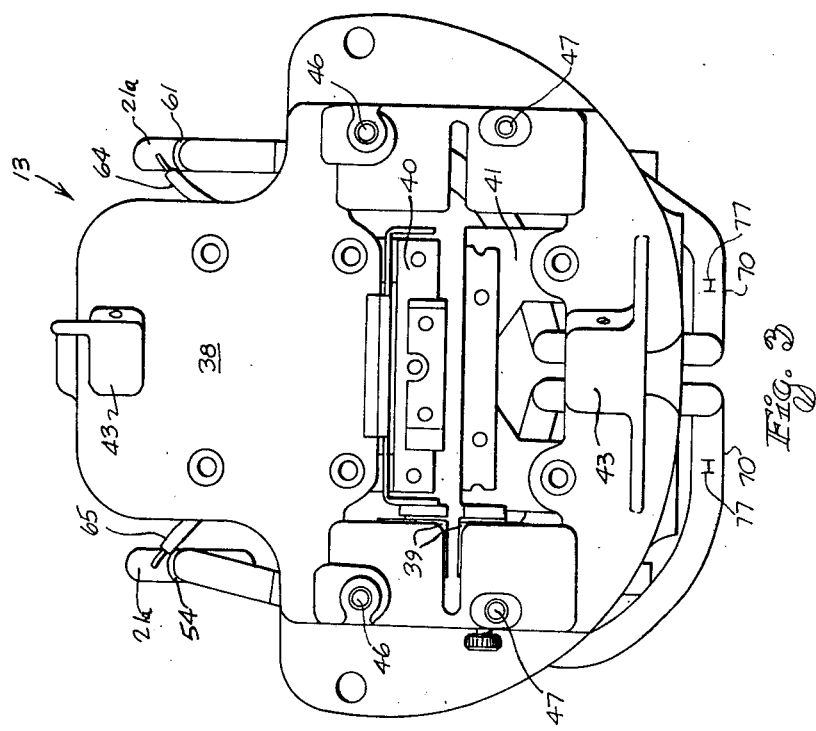

METHOD FOR MAKING A HEAT SENSITIVE FAULT DETECTING AND INDICATING DEVICE FOR WATTHOUR METER

RELATED APPLICATION

This application is a division of my copending U.S. application Ser. No. 585,110, filed June 9, 1975, and entitled "Heat Sensitive Fault Detecting and Indicating System for Watthour Meter" now U.S. Pat. No. 4,017,795.

FIELD OF THE INVENTION

This invention relates to a method for making a heat sensitive fault detecting and indicating device, and, more particularly, relates to such a method for making a device as a part of a watthour meter to monitor at least a portion of a current coil thereof.

BACKGROUND OF THE INVENTION

It is oftentimes necessary, or at least desirable, that various electrical instruments be monitored and an indication established if a fault should occur at any time in the instrument such that the instrument might not thereafter be suitable for its intended purpose. Such is the case, for example, where integrating meters, such as the common watthour meter, is concerned. As is well known, the induction watthour meter normally includes a rotatable disk the speed of which is made proportional to the power delivered to the metered load. Hence, the total number of revolutions by the disk is proportional to the energy consumed so that when used with a calibrated meter, the meter will cumulatively indicate the amount of electrical energy consumed by the load connected with the meter. In the watthour meter, damping, or drag, magnets are commonly utilized to retard disk speed of rotation to thus cause the speed to be made proportional to the power flow through the meter. It is important that the strength of the damping magnets be constant when utilized in the meter since any change in strength after the meter is calibrated and put into service will cause an error in meter readings.

It has heretofore been common when utilizing damping magnets for watthour meters to partially de-magnetize permanent magnets before using the same in commercial meters. Such a process has been successful in stabilizing such magnets for use in watthour meters that are of sufficient reliability so as not to adversely affect watthour meter readings in normal use. It has been found that under unusually severe power frequency faults, the meter may experience a heat producing fault current of sufficient magnitude to adversely affect the permanent magnets causing errors in meter readings. Since most possibly damaging current surges produce heat in the current coils, monitoring of these coils by a heat sensitive fault indicator enables continual meter monitoring and indications to be made if a possibly damaging surge occurs. Obviously, if a possibly damaging current surge has occurred, then it is important that the then possibly unreliable meter be tested to insure continued reliability or be replaced, if necessary.

While devices and methods for making such devices for monitoring meters to indicate a surge have heretofore been known and/or utilized, none of these devices or methods for making the same have been completely successful in providing a device that solves the problem in a reliable manner and/or have not provided a device that solved the problem in such a manner so as to make the indication of a received current surge readily discernible at the meter. Some such prior art devices and/or methods have, for example, utilized various indicators such as, for example, indicating flags, fuses, or temperature sensitive bands or paints attached to the permanent magnet and caused to change color or fall off when an induced current surge is experienced. An example of this type of indicator is shown in U.S. Pat. No. 2,236,277 issued to G. R. Sturtevant on Mar. 25, 1941. The present invention is not frequency limited (such as the Sturtevant device).

In addition, an application related to the above identified patent application, with respect to this application, is also copending, said parent application having been filed by W. C. Kemp and John M. Carr entitled "HEAT SENSITIVE FAULT DETECTING AND INDICATING DEVICE AND METHOD", Ser. No. 585,109, filed June 9, 1975 now U.S. Pat. No. 4,080,567. The method for making a fault detecting and indicating device, as shown in this application, is directed to the same end, but the device and method are distinct from that shown in the Kemp and Carr application.

SUMMARY OF THE INVENTION

This invention provides an improved method for making a heat sensitive fault detecting and indicating device that is particularly useful for watthour meters and provides an indication of a possibly damaging fault current that is readily discernible at the meter. The method of this invention for making a heat sensitive fault detecting and indicating device includes applying a coating of a low melting point metal on a predetermined portion of the meter that would be heated by a current surge of possibly damaging proportions, with the low melting point metal being covered by a sheath having predetermined portions thinned so that the metal will penetrate the thinned portions of the sheath upon receipt of a current surge of sufficient magnitude and duration to cause heating of the meter to melt the low melting point metal.

It is therefore an object of this invention to provide an improved method for making a heat sensitive fault detecting and indicating device.

It is another object of the invention to provide an improved method for making a heat sensitive fault detecting and indicating device that is particularly useful in watthour meters.

It is still another object of this invention to provide an improved method for making a heat sensitive fault detecting and indicating device associated with the current coils of the current stator of a watthour meter.

It is yet another object of this invention to provide an improved method for making a heat sensitive fault detecting and indicating device that utilizes application of a conbination of a low melting point metal and a covering sheath to provide an indication of possible meter fault at only predetermined locations within said meter.

It is another object of this invention to provide an improved method for detecting and indicating faults.

With these and other objects in view as will become apparent to one skilled in the art as the description proceeds, this invention resides in the novel construction, combination, method and arrangement of parts substantially as hereinafter described and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate complete embodiments of the invention according to the best mode so far devised for the practical application of the principles thereof, and in which:

FIG. 3 is a front view of the frame and stator assembly of the watthour meter shown in FIGS. 1 and 2 and illustrates a preferred embodiment of the fault detector and indicating device incorporated therein;

FIG. 4 is a front view of the stator assembly shown in FIG. 3 showing the fault detector and indicating device incorporated therein at a plurality of locations;

FIG. 5 is a bottom view of the stator assembly shown in FIG. 4 illustrating the fault detector and indicating device positioned in a still further location.

DESCRIPTION OF THE INVENTION

Figure 2:
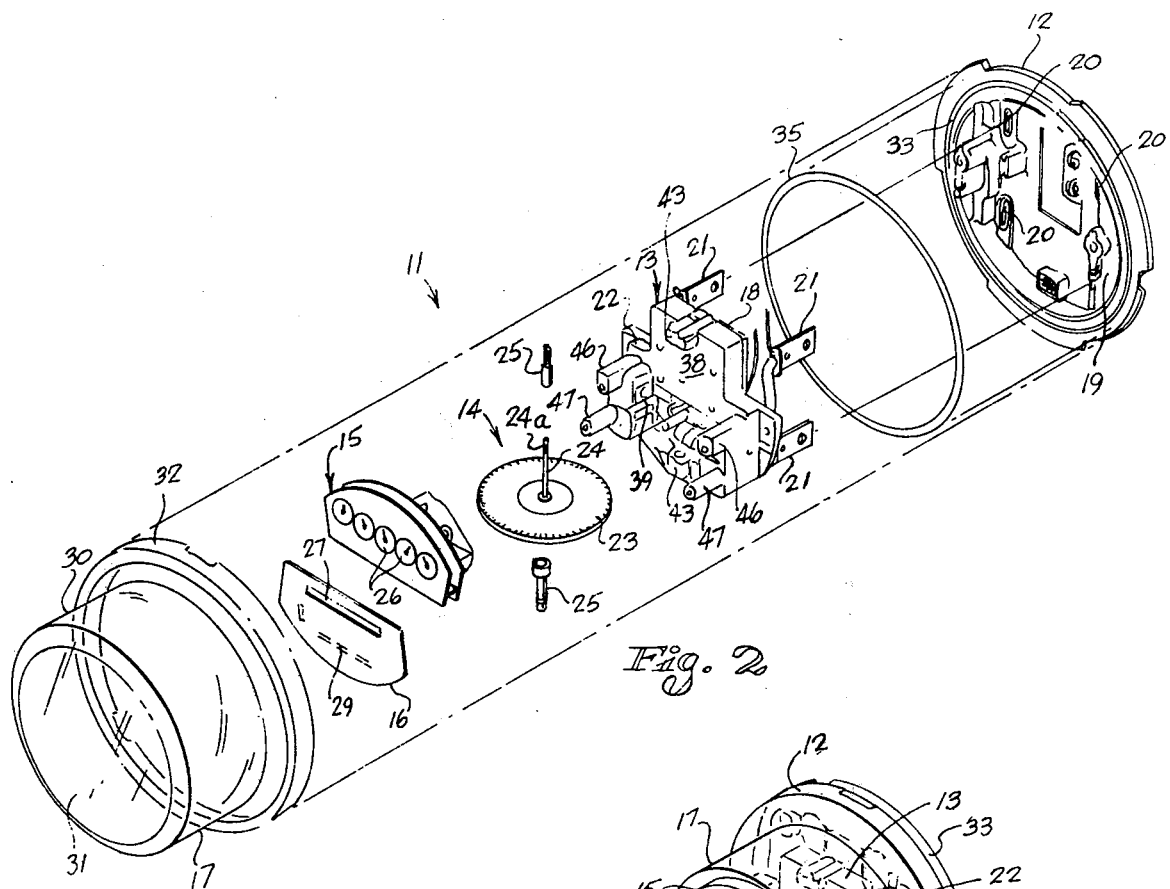
FIG. 2 is an exploded view of the watthour meter shown in FIG. 1.

Referring now to the drawings, the numeral 11 refers generally to a watthour meter having a fault detector and indicating device incorporated therein. As shown best in FIGS. 1 and 2, watthour meter 11 conventionally includes a base plate 12, a frame and stator assembly 13, a disk assembly 14, a register assembly 15, a name plate 16, and a glass cover 17.

As shown, frame and stator assembly 13 is mounted at the rear side 18 to the inner side 19 of the base plate 12, and base plate 12 includes a plurality of apertures 20 through which electrical connectors 21 extend rearwardly from the base plate.

Figure 1:
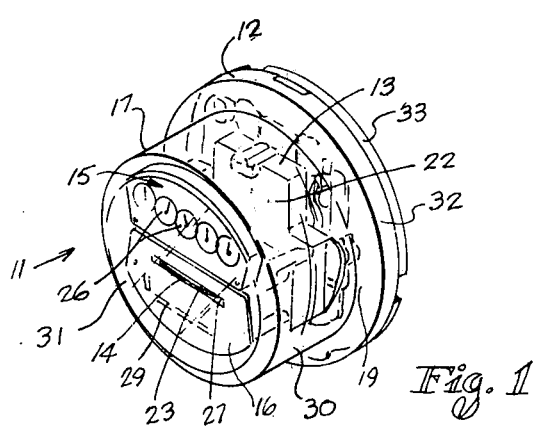
FIG. 1 is a perspective view of a watthour meter having a fault detector and indicating device incorporated therein.

Disk assembly 14 is mounted at the front side 22 of the frame and stator assembly so that disk 23 of the disk assembly 14 rotates along with shaft 24 which shaft is mounted for rotation in the frame and stator assembly by means of bearings 25. As is conventional, rotation of the disk rotates shaft 24 having worm gear 24a thereon to drive the recording dials 26 of register assembly 15 which is likewise mounted to the front side 22 of the frame and stator assembly 13 below the register assembly and has an aperture 27 through which a portion of the periphery of disk 23 extends so as to be visible from the front of the assembled meter as shown in FIG. 1. If desired, plate 16 may have a suitable indicia thereon (as indicated in FIGS. 1 and 2 by the interrupted parallel lines 29).

Glass cover 17 has a cylindrical portion 30 closed at one end 31 and terminating at the other end in an opening defining circular peripheral lip portion 32 that seats against the base plate near the periphery 33 thereof to enclose the remainder of the meter therebetween. A gasket 35 provides a seal between base plate 12 and glass cover 17.

Since the conventional watthour meter is well known, it is not felt necessary to describe such a meter in great detail herein except as is deemed desirable to better illustrate the fault detecting and indicating device which is utilized in such a meter. For greater detail concerning the watthour meter, attention is invited to Electrical Metermen's Handbook, Seventh Edition, published in 1965 by Edison Institute, New York New York.

In operation, a driving torque is developed in the disk 23 by the joint action of the alternating magnetic fluxes produced by the potential stator and by the current stator, and the energy consumed by the load is measured by the meter and recorded on register 15. The driving torque and retarding torque are both developed in the disk. The rotating element is very light and hence friction torque is small. The disk rotates between the poles of the drag magnet to develop a retarding torque proportional to the angular velocity of the disk.

The heat sensitive fault detecting and indicating device is associated with the current stator and the frame and stator assembly has therefore been shown in more detail in FIG. 3 with the stator assembly being shown in still greater detail in FIGS. 4 and 5. As shown in FIG. 3, frame and stator assembly 13 includes a frame 38 upon which is mounted a pair of damping magnets 39, a potential stator 40, and a current stator 41. As also shown, disk assembly mounts 43, having bearings 25 received therein, mount the disk assembly 14. Mounts 46 and 47 are also provided at the front side 22 of the frame and stator assembly 13 to mount the register assembly and name plate, respectively, to the frame and stator assembly.

Current stator 41, as shown best in FIGS. 4 and 5, includes a current core 50 about which current coils 51 and 52 are wound. As shown, coils 51 and 52 are enlarged at shoulders 53 and 54 respectively, which shoulders terminate at blade abutments 21a. If desired, compression gaskets (not shown) may also be utilized. As shown, coils 51 and 52 extend from shoulders 53 and 54 and then are curved upwardly across the front face 56 of the current core and through an aperture 58 therein, then extend outwardly across the back side 59 of the current core and from there extend to enlarged shoulders 61 and 62 which likewise terminate at their opposite sides at contact blades 21. Again, compression gaskets (not shown) may be utilized, if desired. As brought out hereinabove, contact plates 21 extend rearwardly from the current stator and may pass through the base plate 12 to extend rearwardly therefrom. Additionally, as shown in FIG. 3 potential leads 64 and 65 leading to potential stator 40, and more particularly to the potential coil therein, are also connected to shoulders 61 and 54 respectively.

The fault detector and indicating system 70 is shown in the preferred embodiment in FIGS. 3 through 6. As shown best in FIG. 6, current stator coil 51 (coil 52 is identical with respect to having the fault detecting and indicating device associated therewith) includes a metallic current carrying central portion 72 that is coated at least at predetermined points with a low melting point metal 74, such as tin. The low melting point metal may cover the coil as desired, it being only essential that the low melting point metal cover the coil at the predetermined points where a fault is to be visually observed, such as is shown by way of example in FIGS. 3, 4 and 5 to be near the lower and upper ends (FIG. 4) or on the bottom edge (FIG. 5) of the coil.

Figure 6:
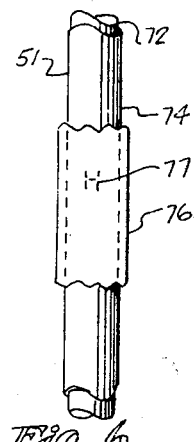
FIG. 6 is a perspective view of a portion of the stator assembly current coil with parts cut away to better illustrate the fault detector and indicating device.

As shown in FIG. 6, the low melting point metal (preferably tin) 74 is covered by a sheath 76, such as, for example, a plastic sheath or other insulating material. The sheath has a suitable indicia 77 (such as an "H" as indicated in FIGS. 3 through 6) embossed thereon at the predetermined points where a fault is to be visually indicated. It has been found that a plastic sheath embossed to a reduced thickness of about 0.003 to 0.005 inches is preferable when tin is utilized as the low melting point metal.

In operation, when a fault current is experienced, the tin melts and penetrates the heat softened thinned area of the sheath to thereafter provide the indication or symbol showing that a possible fault has occurred. Where a plastic sheath is used to cover the tin, the indication is a bright metallic symbol with plastic surrounding the symbol after the fault has occurred. The fault detector and indicating system is responsive to an $I^2Rt$ function, where I is current, R is resistance, and $t$ is time, and operation (ie, melting of the tin to indicate a fault) is dependent thereon. This is in contrast to frequency dependent systems such as, for example, the system described in U.S. Pat. No. 2,236,277.

If desired, the coil could, of couse, be covered with a metal of different melting point as desired to make the fault indication occur at the lower or higher temperature as desired, and the heat softening temperature of the plastic coating may also be varied.

As will be appreciated from the foregoing, this invention provides an improved method for making a heat sensitive fault detecting and indicating device that is well suited for indicating possible faults that can occur in a watthour meter after a current surge has been received at the meter.

What is claimed is:

1. A method for detecting and indicating possible faults in a watthour meter having a current stator which includes a current core and a current coil, said method comprising:

directly applying a low melting point metallic coating to the current coil of the current stator of said watthour meter; and providing a non-conductive covering for said metallic coating that has a reduced thickness portion whereby said metallic coating penetrates said non-conductive coating at said reduced thickness portion when a current surge is received by said current coil sufficient to melt said low melting point metallic coating so that a visual indication of a possible fault is thereafter presented at said covering, said non-conductive coating being a sheath surrounding that portion of said current coil having said metallic coating applied thereto.

2. The method of claim 1 wherein said method includes placing an indicia on said sheath that is responsive to melting of said low melting point metallic coating to thereafter visually indicate that a possible fault has occurred.

3. The method of claim 2 wherein said indicia is in the form of the letter "H" when applied to said sheath.

* * * * *